(12) United States Patent
Stilianos

(10) Patent No.: US 11,839,035 B2
(45) Date of Patent: Dec. 5, 2023

(54) ELECTRONIC CONTROL UNIT HOUSING WITH ELECTRONIC COMPONENT HOLDER

(71) Applicant: VEONEER US SAFETY SYSTEMS, LLC, Southfield, MI (US)

(72) Inventor: Demetri Stilianos, Howell, MI (US)

(73) Assignee: VEONEER US SAFETY SYSTEMS, LLC, Southfield, MI (US)

( * ) Notice: Subject to any disclaimer, the term of this patent is extended or adjusted under 35 U.S.C. 154(b) by 24 days.

(21) Appl. No.: 17/556,125

(22) Filed: Dec. 20, 2021

(65) Prior Publication Data

US 2023/0199979 A1   Jun. 22, 2023

(51) Int. Cl.
*H05K 5/00* (2006.01)
*H01G 11/82* (2013.01)

(52) U.S. Cl.
CPC ........... *H05K 5/0091* (2013.01); *H01G 11/82* (2013.01)

(58) Field of Classification Search
CPC .................................................... H05K 5/0056
See application file for complete search history.

(56) References Cited

U.S. PATENT DOCUMENTS

| | | | | |
|---|---|---|---|---|
| 2,541,828 A | * | 2/1951 | Peck ......................... | H05K 7/12 248/222.12 |
| 2,868,489 A | * | 1/1959 | Calcut ...................... | H05K 7/12 24/304 |
| 5,707,249 A | * | 1/1998 | Byrd .................... | H01M 50/213 361/767 |
| 6,163,460 A | | 12/2000 | Baur et al. | |
| 6,231,370 B1 | * | 5/2001 | Morin ..................... | H01R 12/57 439/698 |
| 6,300,564 B1 | * | 10/2001 | Moraes ................. | H05K 5/0247 361/811 |
| 6,459,042 B1 | * | 10/2002 | Stilianos .............. | H05K 5/0069 174/138 G |
| 2010/0232130 A1 | * | 9/2010 | Kodama ................ | H01G 2/106 361/811 |
| 2013/0105210 A1 | * | 5/2013 | Morita .................... | H01G 11/10 174/260 |
| 2016/0036028 A1 | * | 2/2016 | Tsuruta .................. | H01G 11/76 429/121 |
| 2017/0352495 A1 | * | 12/2017 | Sato ...................... | H05K 5/0026 |
| 2017/0367199 A1 | * | 12/2017 | Hugaud ............... | H05K 5/0013 |
| 2019/0006101 A1 | * | 1/2019 | Matsumae ............... | H01G 9/08 |
| 2019/0135207 A1 | * | 5/2019 | Sumida .................... | H01G 2/04 |
| 2019/0307001 A1 | * | 10/2019 | Karszt .................. | H05K 5/0008 |
| 2022/0392715 A1 | * | 12/2022 | Park ....................... | H01G 2/106 |

* cited by examiner

*Primary Examiner* — Hung V Ngo
(74) *Attorney, Agent, or Firm* — CHRISTOPHER P. MAIORANA, P.C.

(57) ABSTRACT

An apparatus includes a housing, a component cradle, and a plurality of towers. The housing generally has an inner mounting surface. The component cradle may be formed on the inner mounting surface of the housing. The plurality of towers may be formed on and extending from the inner mounting surface of the housing around the component cradle. The towers are generally deformable into a form-fitting engagement with an electronic component placed on the component cradle.

20 Claims, 10 Drawing Sheets

ELECTRONIC CONTROL UNIT HOUSING WITH ELECTRONIC COMPONENT HOLDER

FIELD OF THE INVENTION

The invention relates to automotive control assemblies generally and, more particularly, to a method and/or apparatus for implementing an electronic control unit (ECU) housing with an electronic component holder.

BACKGROUND

Current restraint control system (RCS) electronic control unit (ECU) housings have snaps designed to retain electronic components such as capacitors. The snaps loosen over time due to aging causing the electronic components to become loose. The loosening of the electronic components causes issues with vibration and slipping out of the snaps. Additionally, the existing snap design requires too tight of a tolerance, which is difficult for molding suppliers to maintain.

It would be desirable to implement an electronic control unit (ECU) housing with an electronic component holder that may be used with a heat staking or similar process.

SUMMARY

The invention concerns an apparatus comprising a housing, a component cradle, and a plurality of towers. The housing generally has an inner mounting surface. The component cradle may be formed on and extend from the inner mounting surface of the housing. The plurality of towers may be formed on the inner mounting surface of the housing around the component cradle. The towers are generally deformable into a form-fitting engagement with an electronic component placed on the component cradle.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing an electronic control unit (ECU) housing with an electronic component holder that may (i) be used with a heat staking or similar process, (ii) have a more relaxed tolerance, (iii) mold the electronic component holder around the component during the heat staking process, (iv) reduce occurrences of electronic components slipping and/or falling out, (v) provide more robust capacitor retention, (vi) accommodate multiple capacitor sizes and shapes with a single housing design, (vii) allow components to have straight leads by limiting (or preventing) axial movement that pressures leads.

Figure 1:
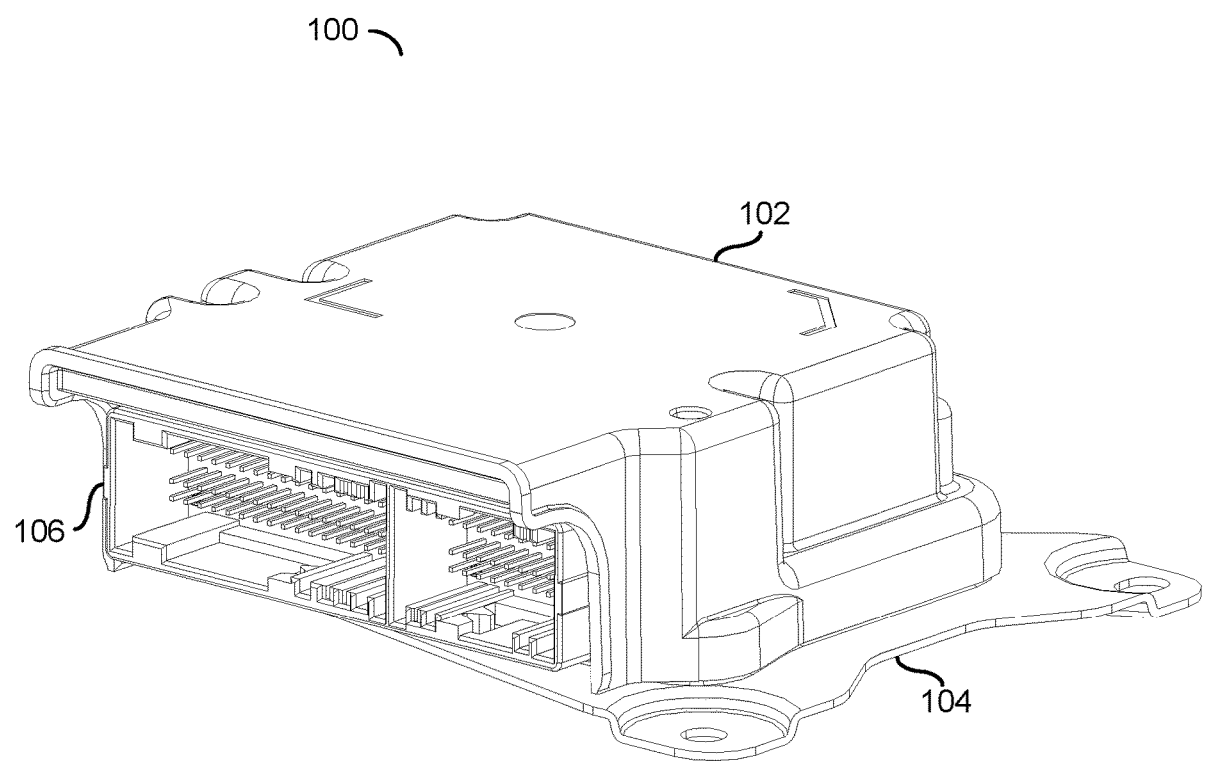
FIG. 1 is a diagram illustrating a perspective view of an electronic control unit with a housing in accordance with an example embodiment of the invention.

Referring to FIG. 1, a diagram is shown illustrating a perspective view of an apparatus 100 utilizing an upper housing in accordance with an example embodiment of the invention. In various embodiments, the apparatus 100 may implement an electronic control unit (or module). In an example, the apparatus 100 may implement a restraint control system (RCS) electronic control unit (ECU). The apparatus 100 generally comprises an upper housing 102, a lower housing (or cover or baseplate) 104 and a subassembly 106.

The upper housing 102 may be implemented as a non-conductive enclosure. In some embodiments, the upper housing 102 may be configured to provide an environmentally sealed enclosure while mated with the lower housing 104 and the subassembly 106. The upper housing 102 may protect components and devices of the subassembly 106. In an example, the upper housing 102 may be formed of a plastic or resin-based material. In various embodiments, the plastic or resin-based material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. However, other materials may be implemented to meet the design criteria of a particular application. In various embodiments, the upper housing 102 may be formed using various techniques including, but not limited to, casting, injection molding, and three-dimensional printing.

The lower housing 104 may be implemented as an electrically conductive baseplate. The lower housing 104 is generally configured to provide mechanical support, thermal cooling and electrical grounding for the apparatus 100. In various embodiments, the lower housing 104 may comprise a die-cast Aluminum baseplate. In another example, the baseplate 104 may be implemented as a stamped steel baseplate. Implementing the baseplate 104 with a metallic material may aid in dissipating heat generated by circuitry within the apparatus 100. The baseplate 104 is generally configured to provide a mounting footprint for the apparatus 100. In an example, the baseplate 104 may be implemented with an RCM8 mounting footprint to simplify testing. However, other footprints may be implemented to meet the design criteria of a particular application.

The subassembly (or electrical assembly) 106 may implement an electronic component of the apparatus 100. The subassembly 106 may be operational to perform one or more electrical functions. The electrical functions may include, but are not limited to, providing grounding paths for all electrical components inside the apparatus 100 to the exterior of the apparatus 100, transfer electrical inputs from different circuits in the vehicle to electronic components mounted inside the apparatus 100, monitor the performance of electronic sensors in the vehicle, and/or transmit acceleration changes in the vehicle to the electronic components mounted in the apparatus 100. In various embodiments, the subassembly 106 generally comprises a plate having one or more integrated connectors attached to one or more printed circuit boards (PCBs). The plate may be shaped to form a fifth side of the apparatus 100 while secured to the upper housing 102. The one or more printed circuit boards may contain electrical circuitry configured to perform the electrical functions.

Figure 2:
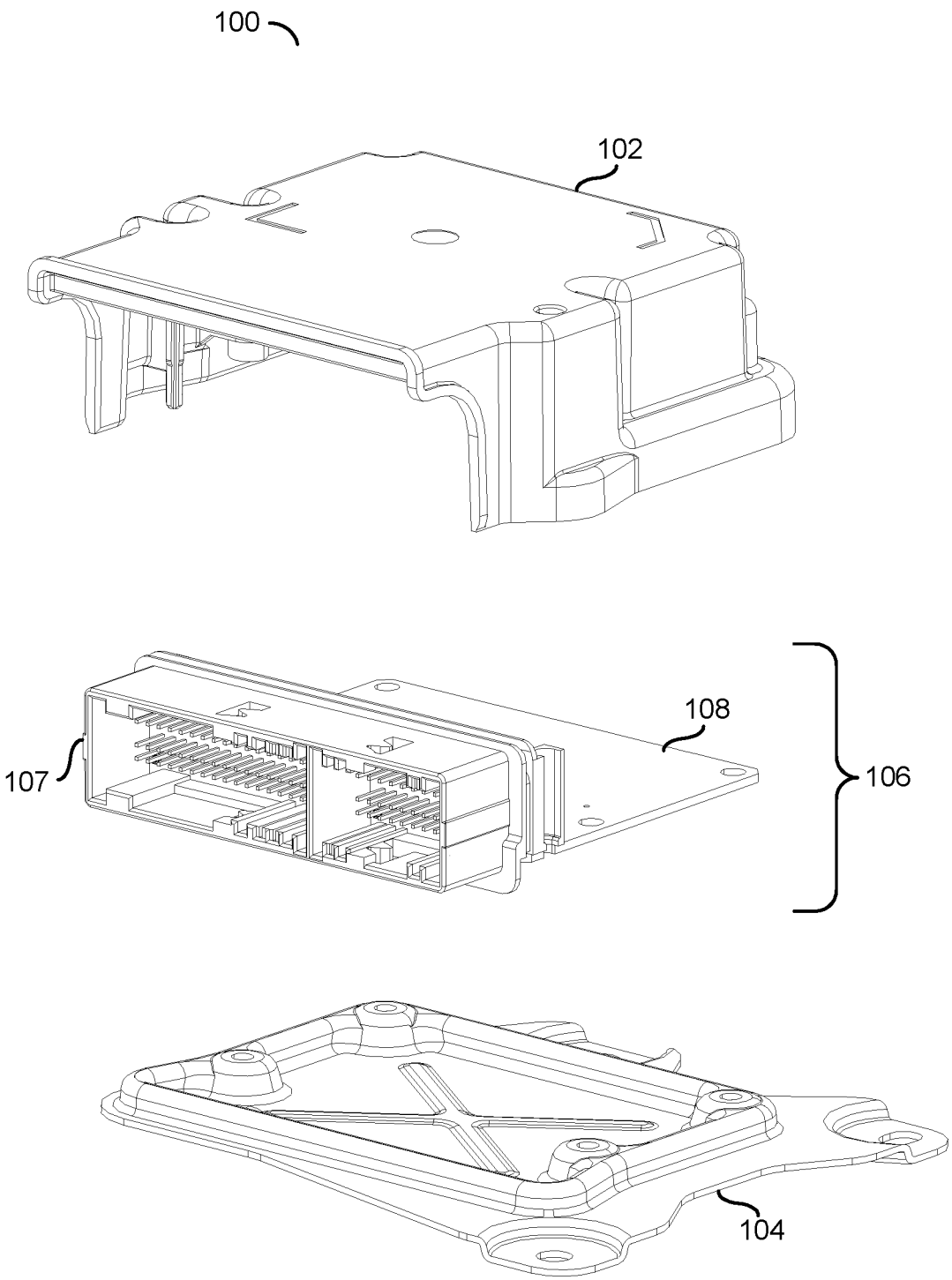
FIG. 2 is a diagram illustrating an exploded view of the electronic control module of FIG. 1.

Referring to FIG. 2, a diagram is shown illustrating an exploded view of the electronic control module 100 of FIG. 1. In an example, assembly of the electronic control module 100 may comprise assembling the subassembly 106 by attaching a connector assembly 107 to a circuit board assembly 108, attaching the circuit board assembly 108 with the attached connector assembly 107 to the upper housing 102, and assembling the lower housing 104 to the upper housing 102 (e.g., using threaded fasteners, etc.). In some embodiments, a gasket or sealant material (not shown) may be applied between one or more of the upper housing 102, the lower housing 104, and the subassembly 106.

In an example, an assembly process for the subassembly 106 may comprise a number of steps. In an example, a raw terminal carrier may be fed to a stitching station. The stitching station may stitch a row of terminal pins into the raw carrier. The stitching station may then pass the stitched carrier to a form station, where the form station forms an appropriate (e.g., 90 degrees, etc.) bend for the current row. The stitching and forming processes may be repeated until a number or rows of terminal pins desired have been stitched and formed to produced a completed terminal carrier assembly. The completed terminal carrier assembly may then be assembled to a connector shroud to form the connector assembly 107. The connector assembly 107 may then be assembled to a printed circuit board substrate of the circuit board assembly 108 to form the subassembly 106.

In various embodiments, the terminal carrier generally includes a feature on each side (end) of the terminal carrier. The features are generally configured to align the terminal carrier with an interior surface of sides of the upper housing 102. In various embodiments, a profile of the connector assembly 107 and the features may be configured to align the circuit board assembly 108 within the upper housing 102.

Figure 3A:
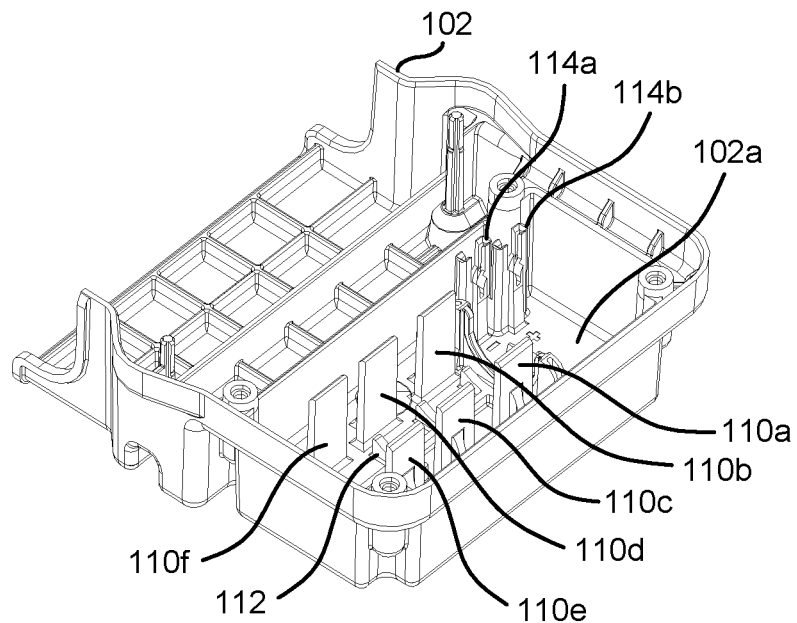
FIG. 3A is a diagram illustrating an interior space of an apparatus upper housing in accordance with an example embodiment of the invention.

Referring to FIG. 3A, a diagram is shown illustrating an interior space of the upper housing 102 in accordance with an example embodiment of the invention. The upper housing 102 generally comprises four sides which define an interior space (e.g., rectilinear volume) within the apparatus 100. The sides of the upper housing 102 generally define a space within which an electronic component may be mounted and a pre-assembled subassembly inserted during manufacturing.

The upper housing 102 generally has an interior mounting surface 102a. In an example, the electronic component is generally inserted between a plurality of tower features 110a-110n that are formed on and extend perpendicularly from the interior mounting surface 102a of the upper housing 102. In an example, six tower features 110a-110f may be implemented. The electronic component generally is set on a component cradle feature 112 that is formed on the interior mounting surface 102a of the upper housing 102. In an example, the component cradle feature 112 may comprise one or more features extending along the interior surface 102a and defining an arcuate support for the electronic component.

In an example, the electronic component may be secured within the upper housing 102 by deforming the tower features 110a-110f into a form-fitting engagement with the electronic component. In an example, the deformation of the tower features 110a-110f may be non-elastic to ensure the deformed tower features 110a-110f hold the electronic component securely, even with aging. In an example, the tower features 110a-110f may be deformed using a heat staking process. In another example, the tower features 110a-110f may be deformed using ultrasonic melting, swagging, or some other process. The electronic component is generally held securely between the form-fitting tower features 110a-110f and the component cradle feature 112.

The upper housing 102 may be further configured to electrically connect the electronic component to the printed circuit board assembly 108. In an example, a number of connectors 114a-114n may be formed on the interior surface 102a of the upper housing 102. In an example, a pair of connectors 114a and 114b may be formed on the interior surface 102a of the upper housing 102. The connectors 114a and 114b may be configured to receive leads from the electronic component and electrically connect the leads to the printed circuit board assembly 108 when inserted. In an example, the connectors 114a and 114b may be configured to accept insertion of insulation displacement contacts (IDCs). The IDCs may be configured to electrically connect the electronic component (e.g., a capacitor) mounted within the upper housing 102 to the printed circuit board substrate of the subassembly 106.

In designs where the upper housing 102 holds the electronic component and the insulation displacement contacts, the insulation displacement contacts are generally pressed onto the leads of the electronic component. The IDCs may comprise compliant pins that may be inserted (or press fit) into plated holes (or vias) on the printed circuit board substrate of the subassembly 106. Compliant pins generally need some insertion (or press fit) force in order to be assembled to plated holes in a printed circuit board (PCB). The upper housing 102 may be configured to support the press fit force of the compliant pin portion of the IDCs being assembled to the printed circuit board substrate of the subassembly 106.

Figure 3B:
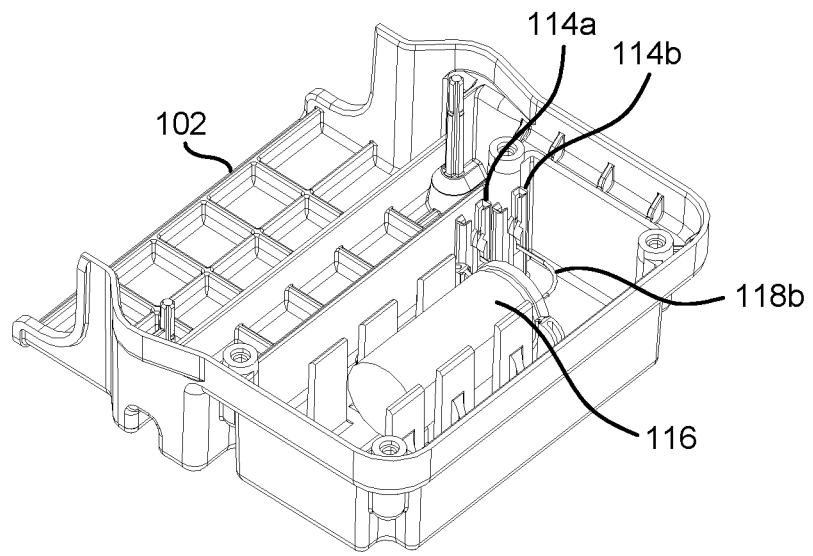
FIG. 3B is a diagram illustrating the interior space of the apparatus upper housing of FIG. 3A with an electronic component inserted.

Referring to FIG. 3B, a diagram is shown illustrating the interior space of the upper housing 102 with an electronic component placed on the component cradle feature 112. In an example, an electronic component 116 may be placed on the component cradle feature 112. In an example, the electronic component 116 may be implemented as a charge storage device. In an example, the electronic component 116 may be implemented as a capacitor. In an example, the electronic component 116 may have a pair of leads 118a and 118b. In an example, the leads 118a and 118b may be formed into right angle (ninety degree) bends and inserted into the connectors 114a and 114b. In another example, the leads 118a and 118b may be straight and the connectors 114a and 114b may located within the upper housing 102 to receive the straight leads.

Figure 4:
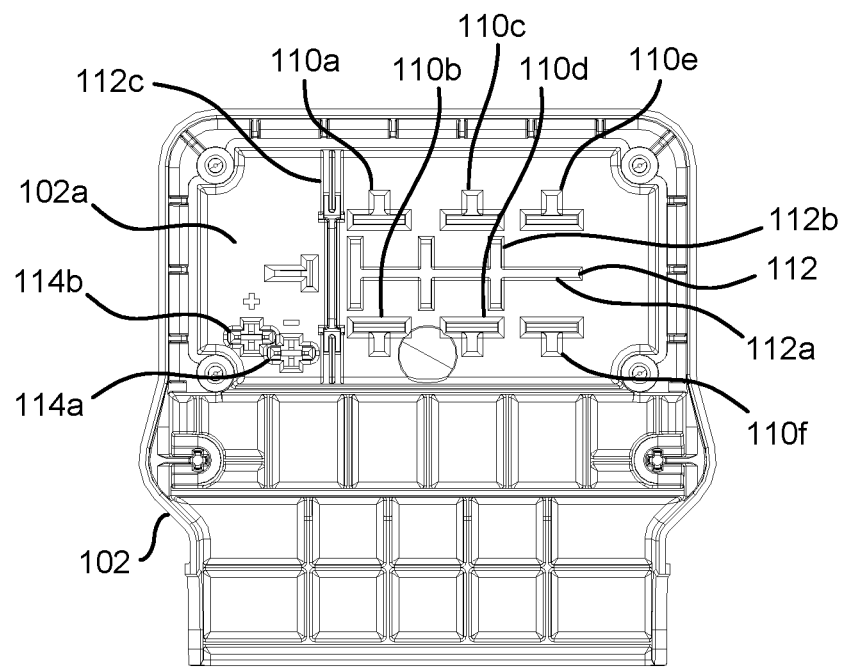
FIG. 4 is a diagram illustrating a plan view of the interior space of the apparatus upper housing of FIG. 3A showing a component cradle and a plurality of towers in accordance with an example embodiment of the invention.

Referring to FIG. 4, a diagram of a plan view of the upper housing 102 is shown illustrating a component cradle and towers in accordance with an example embodiment of the invention. In an example, the component cradle 112 may comprise a first portion 112a and a number of second portions 112b. In some embodiments, the component cradle 112 may further comprise a portion 112c. The first portion 112a may be referred to as a spine. The second portions 112b may be referred to as ribs. The third portion 112c may form an arcuate collar. The spine 112a generally extends along the interior surface 102a in a direction parallel to an axial direction of the electronic component 116. The ribs 112b generally extend along the interior surface 102a perpendicular to the spine 112a. In an example, the ribs 112b may be spaced uniformly along the spine 112a. In another example, the ribs 112b may be spaced to match a contour of the electronic component 116. In an example, the ribs 112b may be formed to follow the contour of the electronic component 116. For example, when the electronic component 116 is cylindrical in shape, the ribs 112b may define arcuate supports for the electronic component 116. However, other contours may be implemented to meet design criteria of a particular implementation.

Figure 5:
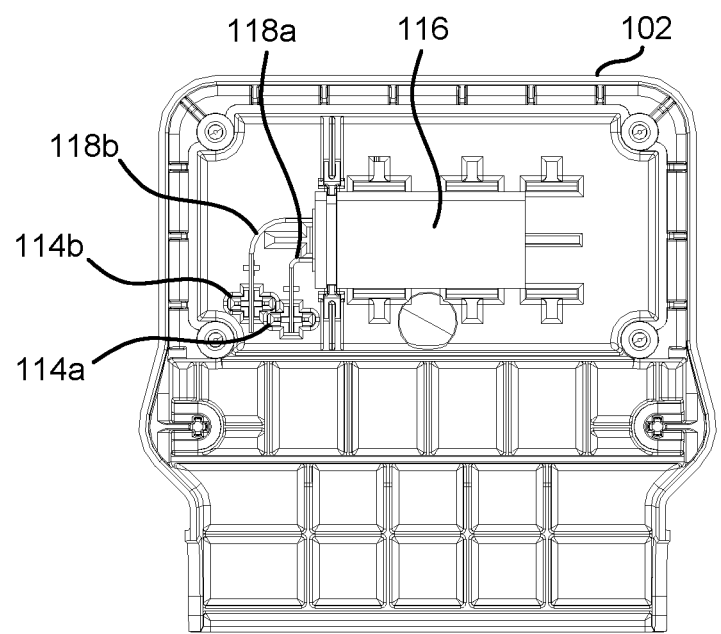
FIG. 5 is a diagram illustrating the component cradle and towers of FIG. 4 with an electronic component inserted.

Referring to FIG. 5, a diagram of plan view of the upper housing 102 is shown illustrating an electronic component placed on the component cradle between the towers of FIG. 4. In an example, the electronic component 116 may be placed on the component cradle 112 between the towers 110a-110f. In an example, the electronic component may be biased toward one end of the component cradle 112. In an example, the towers 110a-110f may be arranged in pairs. The pairs of towers 110a-110f may be spaced uniformly or non-uniformly along a length of the component cradle 112. However, other arrangements may be implemented to meet design criteria of a particular application. In an example, the towers 110a-110f may encompass a space that is longer (wider) than an axial length of the electronic component 116. By spacing the towers 110a-110f over a distance that is longer than the axial length of the electronic component 116, the towers 110a-110f may be enabled, when deformed into a form-fitting engagement with the electronic component 116, to limit (or prevent) the electronic component 116 from moving along the axial direction, limiting (or preventing) stress from being placed on the leads 118a and 118b.

Figure 6:
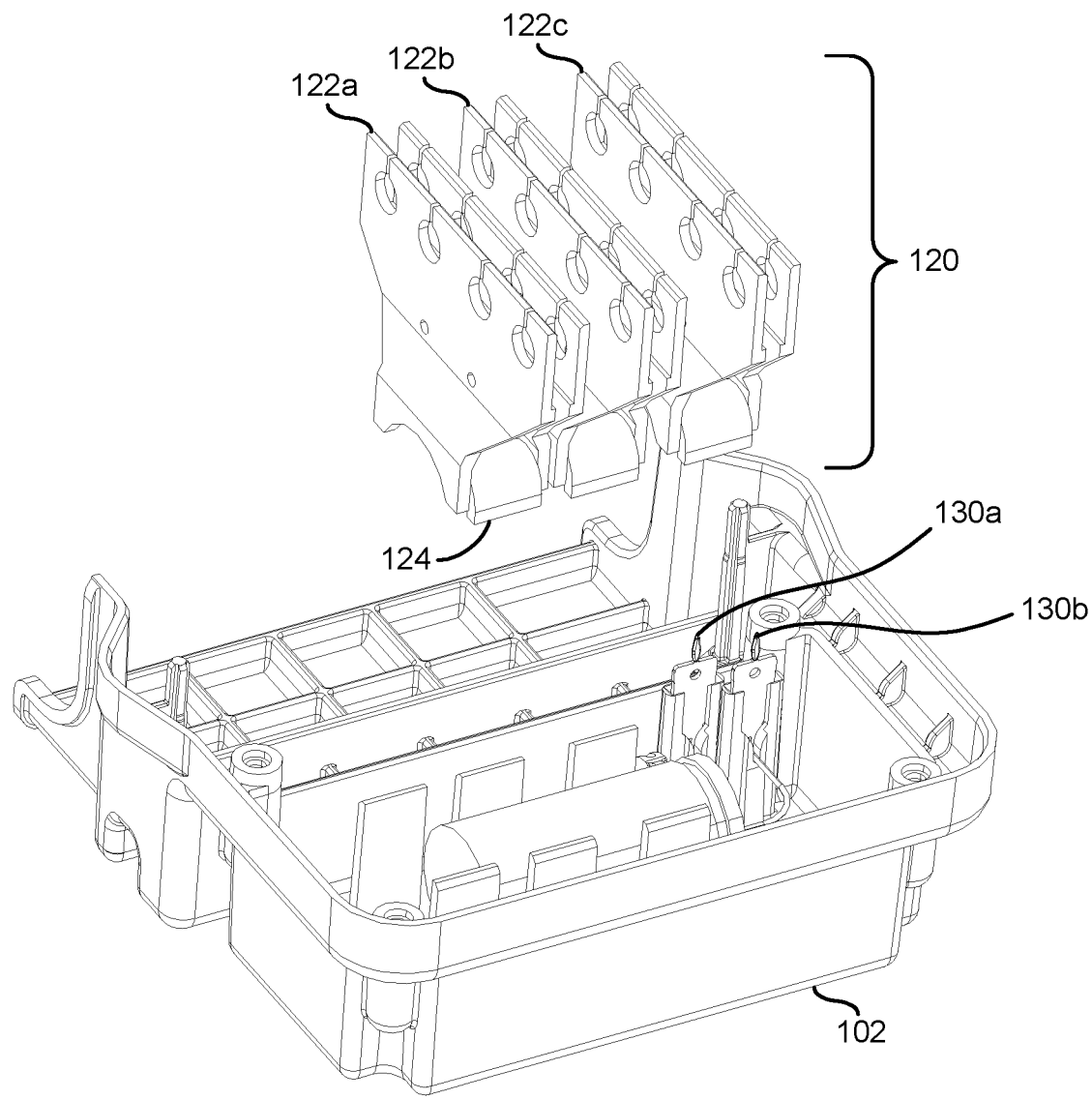
FIG. 6 is a diagram illustrating the apparatus upper housing of FIG. 3B with the electronic component inserted and ready for a heat staking operation in accordance with an example embodiment of the invention.

Referring to FIG. 6, a diagram is shown illustrating the apparatus upper housing of FIG. 3B with the electronic component inserted and ready for a heat staking operation in accordance with an example embodiment of the invention. In embodiments where the towers 110a-110f are deformed using a heat staking process, a heat staking punch 120 may be used. In an example, the heat staking punch 120 may comprise a number of sections 122a-122n. In an example, the heat staking punch 120 may comprise three sections 122a-122c corresponding to the pairs of the towers 110a-110f. Each of the sections 122a-122c may be configured to engage a pair of the towers 110a-110f to deform the towers into form-fitting alignment with the electronic component 116. In an example, each of the sections 122a-122c may comprise a heat staking element 124 corresponding to each tower of a respective pair of towers. In an example, the heat staking element 124 may be configured to heat and form (or shape) the heated tower into the form-fitting engagement with the electronic component 116.

In an example, the section 122a may be positioned to engage the towers 110e and 110f, the section 122b may be positioned to engage the towers 110c and 110d, the section 122c may be positioned to engage the towers 110a and 110b. In an example, by dividing the heat stake punch 120 into the number of sections 122a-122n, the heat stake punch 120 may be better able to deform the plurality of towers 110a-110n into the form-fitting engagement with the contour of the electronic component 116. In an example, the section 122a may be enabled to be inserted into the upper housing 102 deeper than the sections 122b and 122c which may be limited by the electronic component 116. By being inserted deeper into the upper housing 102, the section 122a may be enabled to deform the towers 110e and 110f into a form-fitting engagement with a bottom surface of the electronic component 116, thus limiting axial movement of the electronic component 116.

Also shown in FIG. 6, is a pair of insulation displacement contacts (IDCs) 130a and 130b. The IDCs 130a and 130b may be inserted into the connectors 114a and 114b. In an example, the IDCs 130a and 130b may comprise compliant pins that may be inserted (or press fit) into plated holes (or vias) on the printed circuit board substrate of the subassembly 106. Compliant pins generally need some insertion (or press fit) force in order to be assembled to plated holes in a printed circuit board (PCB). The upper housing 102 may be configured to support the press fit force of the compliant pin portion of the IDCs 130a and 130b being assembled to the printed circuit board substrate of the subassembly 106. The IDCs 130a and 130b generally provide an electrical connection between the printed circuit board assembly 108 and the leads 118a and 118b of the electronic component 116.

Figure 7:
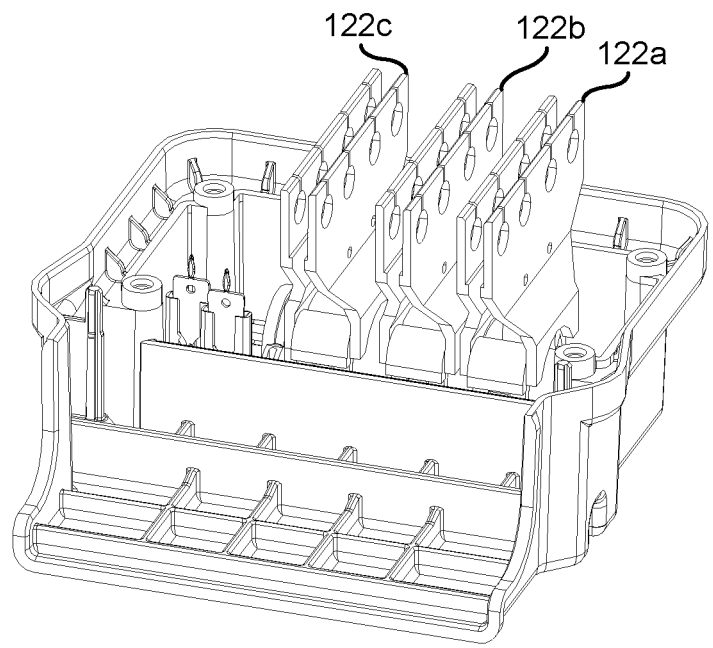
FIG. 7 is a diagram illustrating the apparatus upper housing of FIG. 6 with a heat stake punch inserted to heat stake the towers around the electronic component.

Referring to FIG. 7, a diagram is shown illustrating the apparatus upper housing 102 of FIG. 6 with the sections 122a-122c of the heat stake punch 120 inserted to heat stake the towers 110a-110f around the electronic component.

Figure 8:
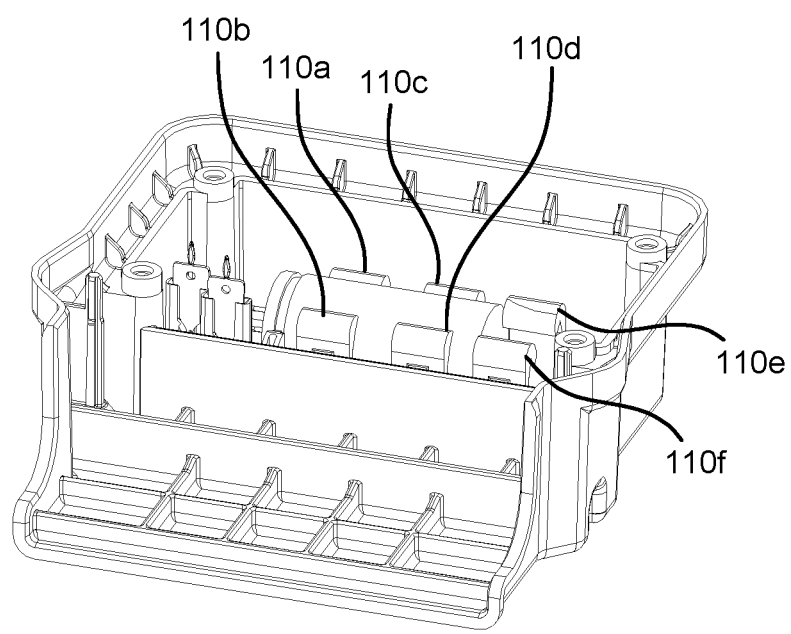
FIG. 8 is a diagram illustrating the apparatus upper housing of FIG. 7 after the heat stake punch is removed.

Referring to FIG. 8, a diagram is shown illustrating the apparatus upper housing 102 of FIG. 7 after the heat stake punch 120 is removed. By using separate sections 122a-122c, the heat stake punch 120 is generally enabled to deform the towers 110a-110d into form-fitting engagement with the contour of the electronic component 116, while the towers 110e and 110f may be deformed into form-fitting engagement with the contour of the electronic component 116 and/or the bottom surface of the electronic component 116.

Figure 9A:
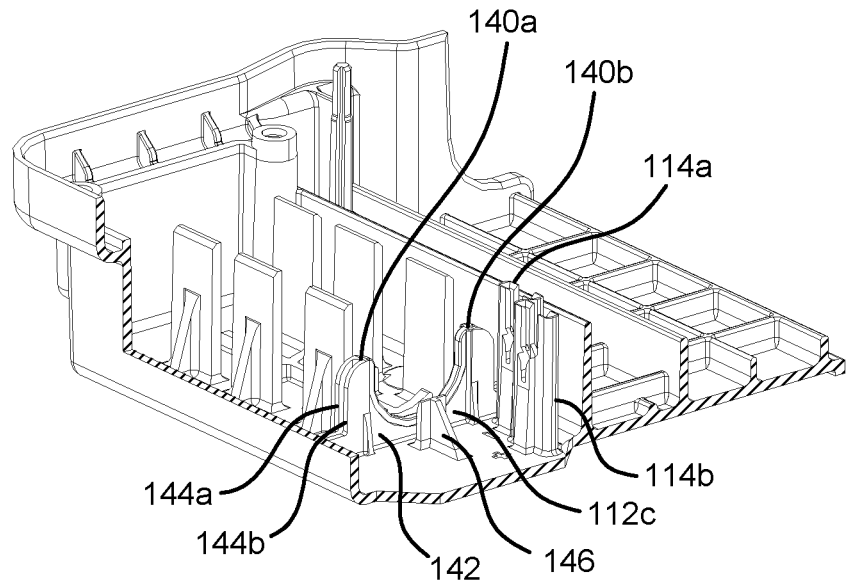
FIG. 9A is a diagram illustrating an interior space of an apparatus upper housing in accordance with an example embodiment of the invention.
Figure 9B:
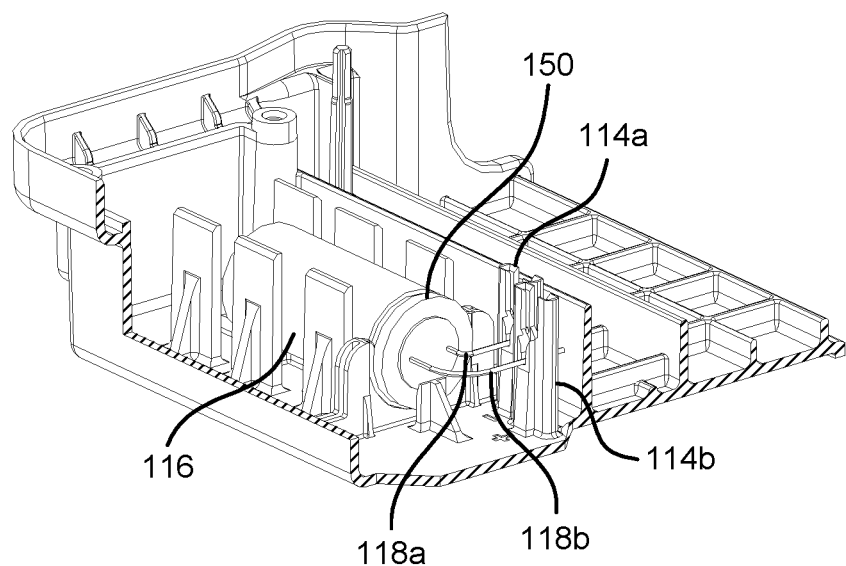
FIG. 9B is a diagram illustrating the interior space of the apparatus upper housing of FIG. 9A with an electronic component inserted.

Referring to FIGS. 9A and 9B, diagrams are shown of a cut-away view illustrating an interior space of the upper housing 102 in accordance with an example embodiment of the invention. In an example, the component cradle 112 may further comprise the portion 112c. In an example, the portion 112c may comprise a pair of towers 140a and 140b, a continuous retaining wall 142, and pairs of parallel stiffeners 144a and 144b. The continuous retaining wall 142 generally extends along the inner surface 102a of the upper housing 102 and between the pair of towers 140a and 140b. The continuous retaining wall 142 generally defines an arcuate collar. In an example, a surface of the electronic component 116 may comprise a depression or groove 150 near one end of the electronic component 116. The arcuate collar defined by the continuous retaining wall 142 may be configured to interface with the depression or groove 150 of the electronic component 116. A pair of parallel stiffeners 144a and 144b generally extend from each of the pair of towers 140a and

140b. The pair of parallel stiffeners 144a and 144b generally define a U-shaped channel in alignment with the continuous retaining wall 142. Each of the stiffeners 144a and 144b generally has an "L" or boomerang shape comprising an upper portion extending along a respective tower and a lower portion extending along the inner surface 102a of the upper housing 102, perpendicular from the upper portion.

Referring to FIG. 9B, a diagram is shown illustrating the interior space of the upper housing 102 of FIG. 9A with the electronic component 116 inserted. In an example, the groove 150 of the electronic component 116 may be placed into position on the arcuate collar defined by the continuous retaining wall 142 extending along the inner surface 102a of the upper housing 102 and between the pair of towers 140a and 140b. The arcuate collar may further limit movement of the electronic component 116 along the axial direction, reducing strain on the leads 118a and 118b and the connectors 114a and 114b.

Figure 10A:
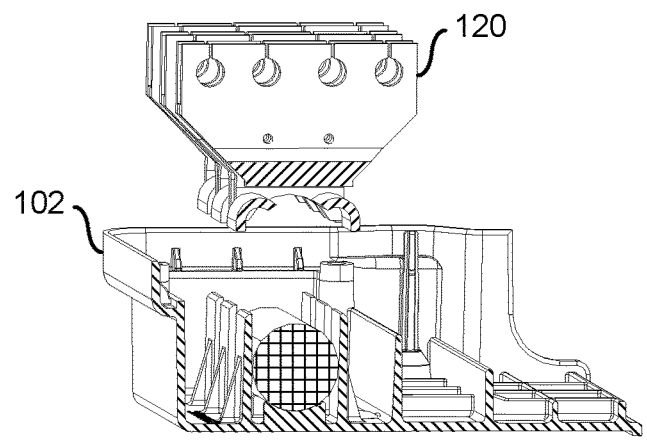
FIGS. 10A-10C are diagrams illustrating the heat staking operation in accordance with an example embodiment of the invention.
Figure 10B:
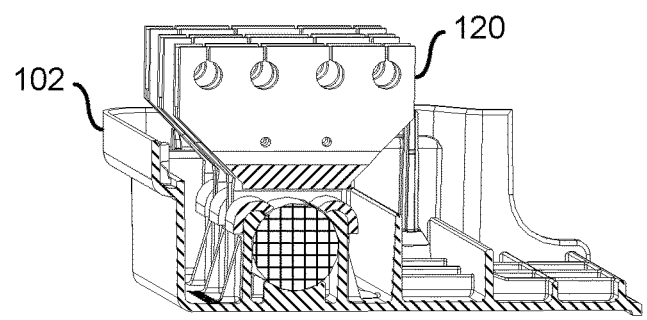
Figure 10C:
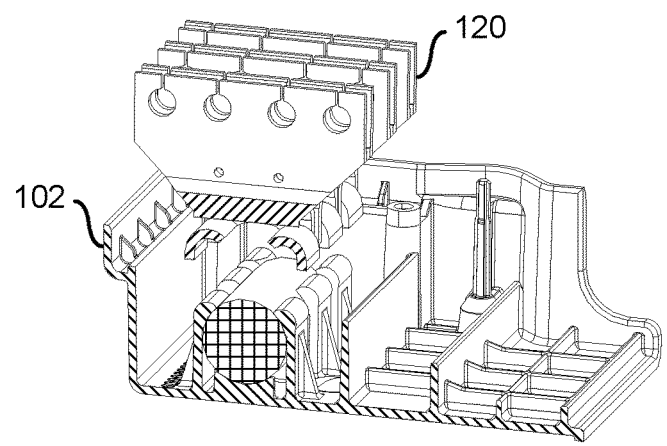

Referring to FIGS. 10A-10C, diagrams are shown illustrating a heat staking operation in accordance with an example embodiment of the invention. In a first step illustrated by FIG. 10A, an electronic component is placed on the component cradle and between a plurality of towers within the upper housing 102. The heat staking punch 120 may be aligned with the plurality of towers and inserted into the upper housing 102 until the plurality of towers are deformed into form-fitting engagement with the contour of the electronic component (as illustrated in FIG. 10B). The heat staking punch 120 may be held in position long enough to ensure the deformation of the towers is set. Then, as illustrated in FIG. 10C, the heat staking punch 120 may be removed from the upper housing 102 leaving the electronic component securely mounted in the upper housing 102.

Figure 11:
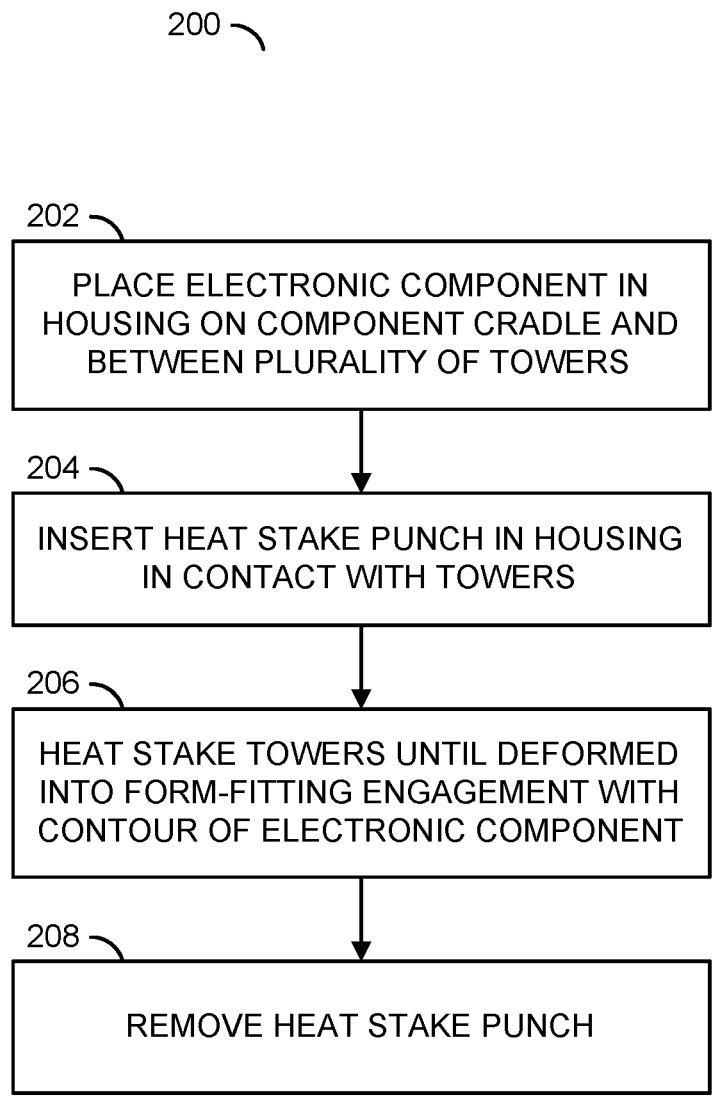
FIG. 11 is a flow diagram illustrating an assembly process in accordance with an example embodiment of the invention.

Referring to FIG. 11, a flow diagram is shown illustrating an assembly method in accordance with an example embodiment of the invention. A method (or process) 200 may be implemented to assemble an electronic component to an upper housing formed in accordance with an example embodiment of the invention. The method 200 may be implemented in a common production facility using typical assembly equipment and techniques. The method 200 generally comprises a step (or state) 202, a step (or state) 204, a step (or state) 206, and a step (or state) 208.

In the step 202, the electronic component 116 may be placed on the component cradle 112 and between the towers 110a-110f within the upper housing 102. In various embodiments, leads 118a and 118b of the electronic component 116 may be bent into right angles to allow insertion of ends of the leads 118a and 118b into connectors 114a and 114b.

In the step 204, the heat stake punch 120 may be inserted into the upper housing 102 and into contact with the towers 110a-110f. In an example, the heat stake punch 120 may comprise a number of sections 122a-122c. Each of the sections 122a-122c may be aligned with a respective set (e.g., pair) of the towers 110a-110f. Each of the sections 122a-122c may be controlled and/or moved independently.

In the step 206, the heat staking punch 120 may be inserted further into the upper housing 102 until the towers 110a-110f are deformed into form-fitting engagement with the electronic component 116. A depth of each section 122a-122c of the heat stake punch 120 may be controlled independently to ensure that the towers 110a-110f are deformed to follow and form-fittingly engage any variations in the contour of the electronic component 116. In an example, the towers 110a-110f on either side of the electronic component 116 may limit motion of the electronic component 116 in two dimensions (or directions), one parallel to the inner surface 102a of the upper housing 102 and one normal (perpendicular) to the inner surface 102a of the upper housing 102. In an example, the towers near an end (e.g., bottom) of the electronic component 116 may be staked further, forming a curl that may limit motion of the electronic component 116 in a third (e.g., axial) dimension (or direction).

In the step 208, the heat stake punch 120 may be removed from within the upper housing 102.

Figure 12:
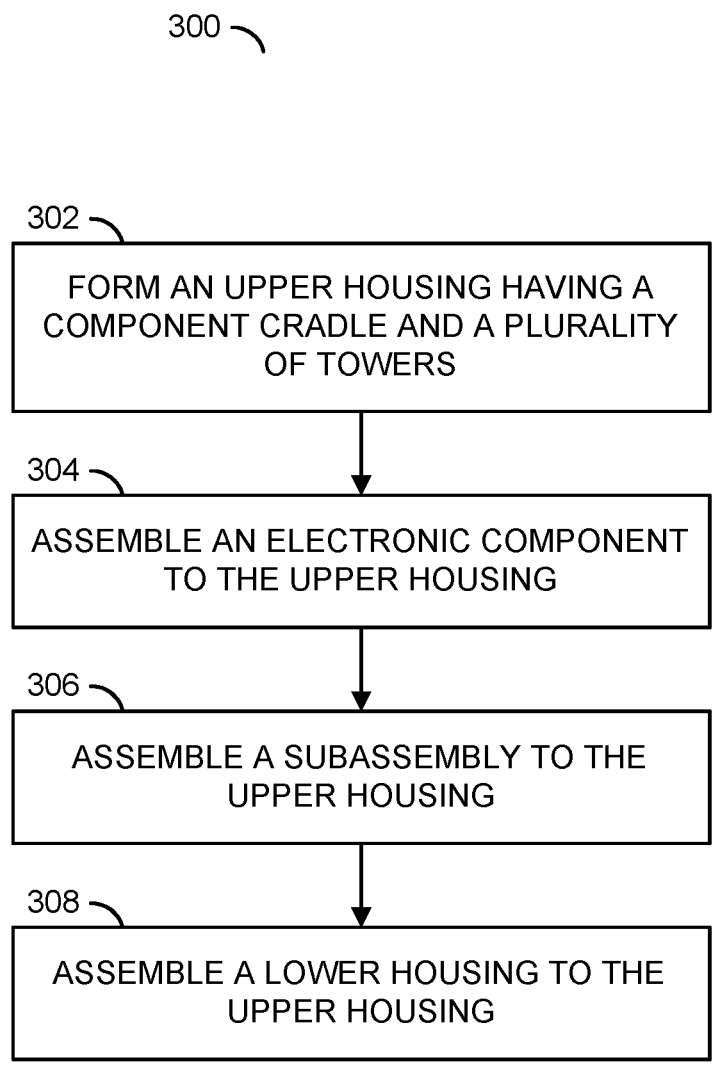
FIG. 12 is a flow diagram illustrating an assembly process in accordance with an example embodiment of the invention.

Referring to FIG. 12, a flow diagram is shown illustrating an assembly method in accordance with an example embodiment of the invention. A method (or process) 300 may be implemented to assemble an electronic control unit in accordance with an example embodiment of the invention. The method (or process) 300 may be implemented in a common production facility using typical assembly equipment and techniques. The method 300 generally comprises a step (or state) 302, a step (or state) 304, a step (or state) 306, and a step (or state) 308.

In the step 302, an upper housing for an electronic control unit (ECU) may be formed. In various embodiments, the upper housing is generally formed having an interior mounting surface, a component cradle feature, and a plurality of tower features. The component cradle feature that is generally formed on the interior mounting surface of the upper housing. In an example, the component cradle feature may comprise one or more features extending along the interior mounting surface and defining an arcuate support for an electronic component. The plurality of tower features are generally formed on and extend perpendicularly from the interior mounting surface of the upper housing.

In an example, the upper housing may be implemented as a non-conductive enclosure. In some embodiments, the upper housing may be configured to provide an environmentally sealed enclosure while mated with a lower housing and a subassembly. In an example, the upper housing may be formed of a plastic or resin-based material. In various embodiments, the plastic or resin-based material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. However, other materials may be implemented to meet the design criteria of a particular application. In various embodiments, the upper housing may be formed using various techniques including, but not limited to, casting, injection molding, and three-dimensional printing.

In the step 304, an electronic component may be assembled to the upper housing. In an example, the electronic component may be placed on the component cradle feature and secured within the upper housing by deforming the tower features into a form-fitting engagement with the electronic component. In an example, the deformation of the tower features may be non-elastic to ensure the deformed tower features hold the electronic component securely, even with aging. In an example, the tower features may be deformed using a heat staking process. In another example, the tower features may be deformed using ultrasonic melting, swagging, or some other process. The electronic component is generally held securely between the form-fitting tower features and the component cradle feature.

In the step 306, a pre-assembled subassembly may be assembled to the upper housing. In an example, the pre-assembled subassembly may comprise a connector assembly assembled to a printed circuit board substrate of a circuit board assembly. In an example, a raw terminal carrier may be fed to a stitching station. The stitching station may stitch a row of terminal pins into the raw carrier. The stitching station may then pass the stitched carrier to a form station, where the form station forms an appropriate (e.g., 90 degrees, etc.) bend for the current row. The stitching and forming processes may be repeated until a number or rows of terminal pins desired have been stitched and formed to produced a completed terminal carrier assembly. The completed terminal carrier assembly may then be assembled to a connector shroud to form the connector assembly and the connector assembly assembled may be assembled to the printed circuit board substrate of the circuit board assembly.

In various embodiments, the terminal carrier generally includes a feature on each side (end) of the terminal carrier. The features are generally configured to align the terminal carrier with an interior surface of sides of the upper housing. In various embodiments, a profile of the connector assembly and the features may be configured to align the circuit board assembly within the upper housing.

In designs where the upper housing holds the electronic component and insulation displacement contacts (IDCs), the IDCs are generally pressed onto the leads of the electronic component. The IDCs may comprise compliant pins that may be inserted (or press fit) into plated holes (or vias) on the printed circuit board substrate of the printed circuit board assembly of the subassembly. Compliant pins generally need some insertion (or press fit) force in order to be assembled to plated holes in a printed circuit board (PCB). The upper housing may be configured to support the press fit force of the compliant pin portion of the IDCs being assembled to the printed circuit board substrate of the printed circuit board assembly of the subassembly 106.

In the step 308, a lower housing may be assembled to the upper housing. In an example, the lower housing may be implemented as an electrically conductive baseplate. The lower housing may be configured to provide mechanical support, thermal cooling and electrical grounding for the electronic control unit. In various embodiments, the lower housing may comprise a die-cast Aluminum baseplate. In another example, the lower housing may be implemented as a stamped steel baseplate. Implementing the lower housing with a metallic material may aid in dissipating heat generated by circuitry within the electronic control unit. The lower housing may be configured to provide a mounting footprint for the electronic control unit. In an example, the lower housing may be implemented with an RCM8 mounting footprint to simplify testing. However, other footprints may be implemented to meet the design criteria of a particular application.

In various embodiments, a gasket or dispensed sealant material may be applied between any of the upper housing, the subassembly, and/or the lower housing. The gasket or sealant material may be selected to meet an automotive industry standard for sealing the electronic control unit to a particular environment.

In various embodiments, a housing in accordance with an embodiment of the invention may provide more robust component retention. The housing in accordance with an embodiment of the invention may provide molding suppliers a larger tolerance to work with. The housing in accordance with an embodiment of the invention may accommodate multiple capacitor sizes and shapes using a single housing design. The housing in accordance with an embodiment of the invention may provide a solution for securing components having straight leads, by limiting (or preventing) axial movement that pressures leads. The housing in accordance with an embodiment of the invention may allow near-zero to zero strain on the plastic and hold the component in the X, Y, and Z directions from slipping out and/or becoming loose.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An apparatus comprising:
 a housing having an inner mounting surface;
 a component cradle formed on said inner mounting surface of said housing; and
 a plurality of towers formed on said inner mounting surface of said housing around said component cradle, wherein each tower of said plurality of towers is non-elastically deformed into a form-fitting engagement with a contour of an electronic component placed on said component cradle.

2. The apparatus according to claim 1, wherein said plurality of towers are non-elastically deformed into said form-fitting engagement with said contour of said electronic component using at least one of heat staking, ultrasonic melting, and swagging.

3. The apparatus according to claim 1, wherein said housing comprises three towers on each side of said component cradle.

4. The apparatus according to claim 1, wherein said component cradle comprises a plurality of ribs extending along said inner mounting surface and defining an arcuate support for said electronic component.

5. The apparatus according to claim 1, wherein said electronic component comprises a charge storage device.

6. The apparatus according to claim 1, wherein said electronic component comprises a capacitor.

7. The apparatus according to claim 1, wherein said component cradle further comprises:
 a pair of towers;
 a continuous retaining wall extending along said inner mounting surface of the housing and between said pair of towers, and defining an arcuate collar configured to interface with a corresponding groove of the electronic component; and
 a pair of parallel stiffeners extending from each of the pair of towers and defining a U-shaped channel in alignment with the continuous retaining wall, wherein each stiffener comprises an upper portion extending along a respective tower and a lower portion extending along said inner mounting surface of the housing, perpendicular from the upper portion.

8. The apparatus according to claim 1, wherein said housing further comprises a pair of component mounting features comprising insulation displacement connectors and the insulation displacement connectors are configured to electrically connect the electronic component mounted within the component cradle to a printed circuit board substrate.

9. The apparatus according to claim 8, wherein said pair of component mounting features are formed on said inner mounting surface of said housing such that a pair of leads connecting the electronic component to the insulation displacement connectors form a right angle bend.

10. The apparatus according to claim 1, wherein said housing comprises a polypropylene material.

11. A method for assembling an electronic control unit, comprising the steps of:
forming a housing comprising an inner mounting surface, a component cradle comprising two or more features formed on the inner mounting surface of the housing, and a plurality of towers formed on the inner mounting surface of the housing and around the component cradle, wherein each tower of the plurality of towers is non-elastically deformable into a form-fitting engagement with a contour of an electronic component placed on the component cradle;
placing said electronic component on the component cradle; and
using a heat stake punch to non-elastically deform each tower of the plurality of towers into the form-fitting engagement with the contour of the electronic component placed on the component cradle.

12. The method according to claim 11, wherein:
said component cradle further comprises (i) a pair of towers, (ii) a continuous retaining wall extending along the inner mounting surface of the housing and between the pair of towers, and defining an arcuate collar configured to interface with a corresponding groove of the electronic component, and (iii) a pair of parallel stiffeners extending from each of the pair of towers and defining a U-shaped channel in alignment with the continuous retaining wall, wherein each stiffener comprises an upper portion extending along a respective tower and a lower portion extending along said inner mounting surface of the housing, perpendicular from the upper portion; and
the step of placing said electronic component on the component cradle further comprises aligning the corresponding groove of the electronic component with the arcuate collar of the component cradle.

13. The method according to claim 11, wherein:
said housing further comprises a pair of component mounting features comprising insulation displacement connectors configured to electrically connect the electronic component mounted within the component cradle to a printed circuit board substrate; and
the step of placing said electronic component on the component cradle further comprises bending a pair of leads of the electronic component to form a right angle bend and connecting the pair of leads to the insulation displacement connectors.

14. The method according to claim 13, further comprising assembling a subassembly comprising a connector assembly and a circuit board assembly to the housing, wherein the insulation displacement connectors comprise compliant pins and the compliant pins are connected to the circuit board assembly by inserting the compliant pins into vias of a printed circuit board substrate of the circuit board assembly.

15. The method according to claim 14, further comprising assembling a baseplate to the housing.

16. The method according to claim 11, wherein the housing is formed using at least one of casting, injection molding, and three-dimensional printing.

17. An apparatus comprising:
a housing having an inner mounting surface;
a component cradle formed on said inner mounting surface of said housing; and
a plurality of towers formed on said inner mounting surface of said housing around said component cradle, wherein said towers are deformable into a form-fitting engagement with an electronic component placed on said component cradle and said component cradle comprises (i) a pair of towers, (ii) a continuous retaining wall extending along said inner mounting surface of the housing and between said pair of towers, and defining an arcuate collar configured to interface with a corresponding groove of the electronic component, and (iii) a pair of parallel stiffeners extending from each of the pair of towers and defining a U-shaped channel in alignment with the continuous retaining wall, with each stiffener comprising an upper portion extending along a respective tower and a lower portion extending along said inner mounting surface of the housing, perpendicular from the upper portion.

18. The apparatus according to claim 17, wherein said towers are non-elastically deformable into said form-fitting engagement with a contour of said electronic component using at least one of a heat staking, ultrasonic melting, and swagging.

19. The apparatus according to claim 17, wherein said component cradle further comprises a plurality of ribs extending along said inner mounting surface and defining a support matching a contour of said electronic component.

20. The apparatus according to claim 17, wherein said component cradle further comprises a plurality of ribs extending along said inner mounting surface and defining an arcuate support for said electronic component.

* * * * *